United States Patent
Lin et al.

(10) Patent No.: US 11,222,794 B2
(45) Date of Patent: Jan. 11, 2022

(54) SEMICONDUCTOR FABRICATION SYSTEM EMBEDDED WITH EFFECTIVE BAKING MODULE

(71) Applicant: Taiwan Semiconductor Manufacturing Co., Ltd., Hsin-Chu (TW)

(72) Inventors: Han-Yu Lin, Nantou County (TW); Yi-Ruei Jhan, Keelung (TW); Fang-Wei Lee, Hsinchu (TW); Li-Te Lin, Hsinchu (TW); Pinyen Lin, Rochester, NY (US); Tze-Chung Lin, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 38 days.

(21) Appl. No.: 16/044,314

(22) Filed: Jul. 24, 2018

(65) Prior Publication Data
US 2019/0304812 A1    Oct. 3, 2019

Related U.S. Application Data

(60) Provisional application No. 62/650,384, filed on Mar. 30, 2018.

(51) Int. Cl.
*H01L 21/67* (2006.01)
*H01L 21/677* (2006.01)
*C23C 16/452* (2006.01)

(52) U.S. Cl.
CPC ...... *H01L 21/67063* (2013.01); *C23C 16/452* (2013.01); *H01L 21/67069* (2013.01); *H01L 21/67098* (2013.01); *H01L 21/67103* (2013.01); *H01L 21/67115* (2013.01); *H01L 21/67225* (2013.01); *H01L 21/67248* (2013.01); *H01L 21/67748* (2013.01)

(58) Field of Classification Search
None
See application file for complete search history.

(56) References Cited

U.S. PATENT DOCUMENTS 4,718,974 A * 1/1988 Minaee ............ G03F 7/42 134/1
5,478,401 A * 12/1995 Tsunekawa ....... H01L 21/67109 134/1

(Continued)

FOREIGN PATENT DOCUMENTS

JP         03046225 A  * 2/1991
WO      WO03030243       4/2003

*Primary Examiner* — Karla A Moore
(74) *Attorney, Agent, or Firm* — Haynes and Boone, LLP

(57) ABSTRACT

The present disclosure provides a semiconductor fabrication apparatus. The semiconductor apparatus includes a processing chamber for etching; a substrate stage integrated in the processing chamber and being configured to secure a semiconductor wafer; a reflective mirror configured inside the processing chamber to reflect thermal energy from the heating mechanism toward the semiconductor wafer; and a heating mechanism embedded in the process chamber and is operable to perform a baking process to remove a by-product generated during the etching. The heating mechanism is integrated between the reflective mirror and a gas distribution plate of the processing chamber.

20 Claims, 13 Drawing Sheets

(56) References Cited

U.S. PATENT DOCUMENTS

| | | | | |
|---|---|---|---|---|
| 5,547,642 A | * | 8/1996 | Seiwa | C01B 13/00 |
| | | | | 118/723 R |
| 6,021,152 A | * | 2/2000 | Olsen | C23C 14/12 |
| | | | | 372/99 |
| 6,451,692 B1 | * | 9/2002 | Derderian | C23C 16/34 |
| | | | | 427/255.391 |
| 6,666,924 B1 | * | 12/2003 | van Bilsen | C23C 16/4401 |
| | | | | 118/715 |
| 6,887,803 B2 | * | 5/2005 | Yoo | F27B 17/0025 |
| | | | | 118/50.1 |
| 2012/0055401 A1 | * | 3/2012 | Tozawa | H01L 21/02063 |
| | | | | 118/697 |
| 2015/0214101 A1 | | 7/2015 | Ren et al. | |

* cited by examiner

SEMICONDUCTOR FABRICATION SYSTEM EMBEDDED WITH EFFECTIVE BAKING MODULE

PRIORITY DATA

This application claims priority to U.S. Provisional Patent Application Ser. No. 62/650,384 filed Mar. 30, 2018, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, the functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling-down has also increased the complexity of processing and manufacturing ICs and, for these advances to be realized, similar developments in IC processing and manufacturing equipment are needed. In one example, an etching system is utilized to remove the target material. During the etching process, one or more by-product or residue is generated and contaminates the semiconductor wafer under the processing. The by-product needs to be further removed thereafter to ensure the quality of the processed wafer. However, the existing etching system implemented an inefficient method to remove the by-product. The existing method is not efficient and effective to remove the by-product, leading to low fabrication throughput and degraded etching performance. Accordingly, it would be desirable to provide an IC fabrication system and a method utilizing the same absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
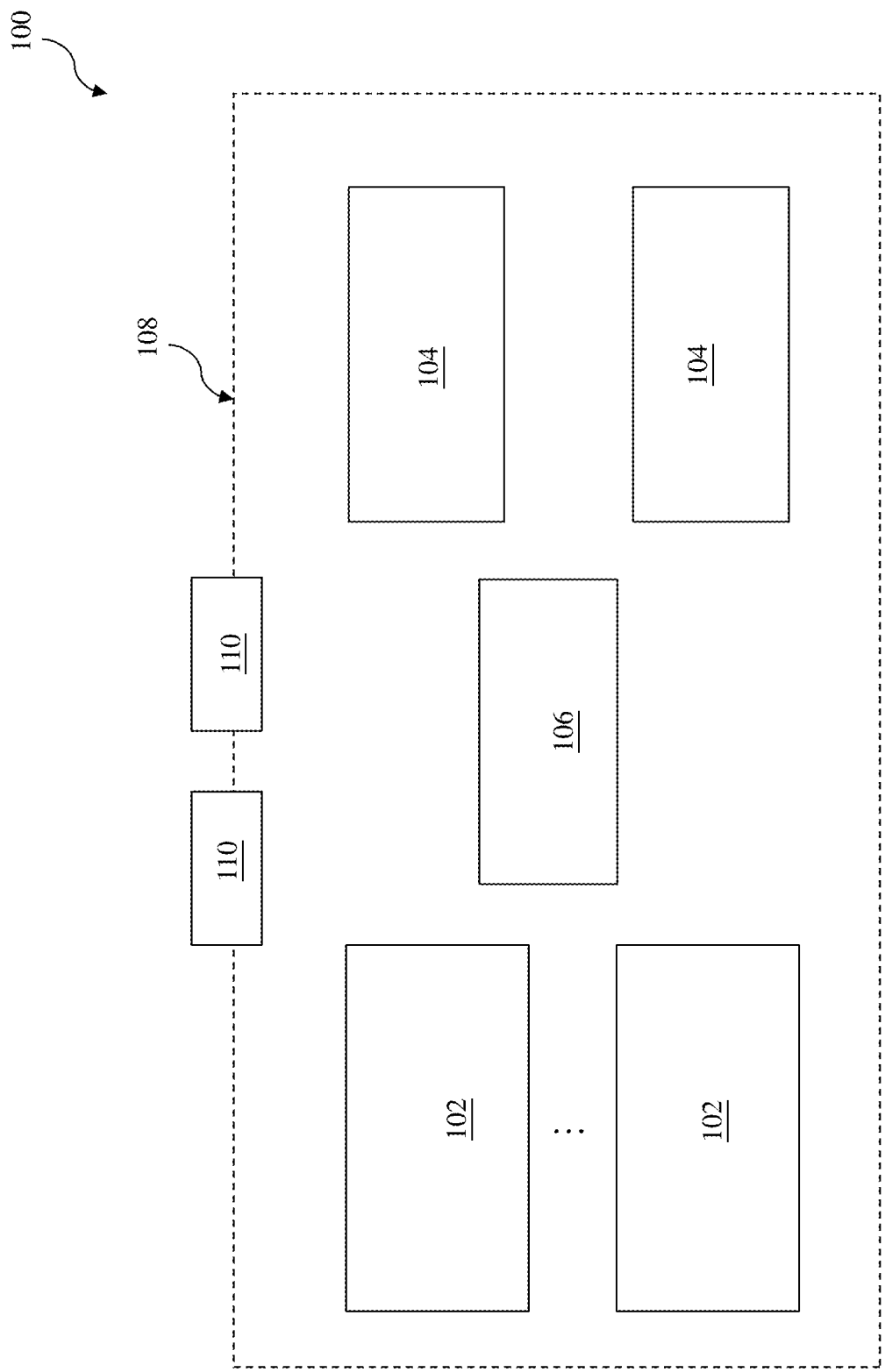
FIG. 1 illustrates a schematic view of a semiconductor processing system for integrated circuit fabrication, constructed in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 illustrates a schematic view of a semiconductor processing system 100 for integrated circuit (IC) fabrication, constructed in accordance with some embodiments. With reference to FIG. 1 and other figures, the system 100 and the method utilizing the same are collectively described below.

The system 100 is designed for IC fabrication, such as for gas chemical etching and cleaning to one or more workpieces, such as semiconductor wafers. The system 100 is a cluster tool with multiple processing chambers integrated together for parallel processing with high throughput. For examples, the system 100 may include 4, 6, or 8 processing chambers. In some embodiments, the system may include chambers with different functions, such as a chemical removal chamber (CRC) 102 and a baking chamber 104. In some embodiments, the system may include 4 chemical removal chambers 102 and 2 baking chambers 104. In some other embodiments, the system 100 includes 6 chemical removal chambers 102 and the baking chambers are eliminated since each chemical removal chamber is integrated with a heating (or baking) mechanism to perform more efficient and effective in-situ baking. Thus, the system 100 functions with enhanced efficiency and further increased throughput.

The system 100 also includes a transfer module 106 designed to transfer the workpiece(s) among various processing chambers. In some embodiments, the transfer module 106 is a vacuum transfer module using a vacuum mechanism to secure the workpiece(s) and a robot to transfer the workpiece(s).

The system 100 with the multiple chambers may be designed and enclosed in a vacuum environment 108 for better processing quality and fabrication efficiency. The workpieces are transferred in and out of the system 100 through an interface, such as one or more load lock module 110.

Figure 2:
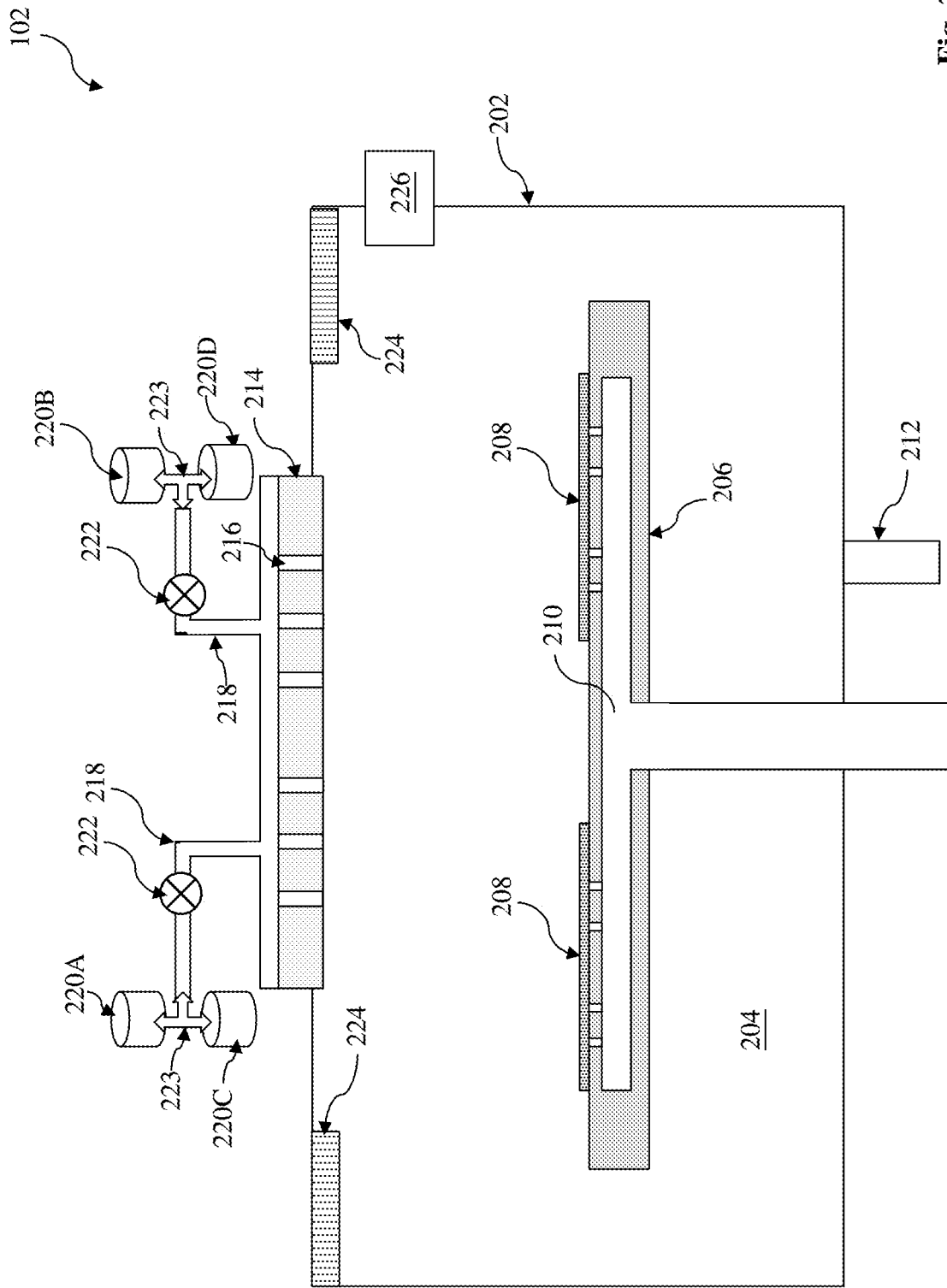
FIG. 2 illustrates a schematic view of a processing chamber of the system in FIG. 1, constructed in accordance with some embodiments.

FIG. 2 illustrates a schematic view of a semiconductor processing chamber (or CRC) 102 for integrated circuit (IC) fabrication, constructed in accordance with some embodiments. As noted above, the CRC 102 is designed to perform IC processing to the workpiece. In the present embodiment, the CRC 102 is designed to perform etching/cleaning and further to perform in-situ baking to the workpiece as well. Particularly, the CRC 102 includes an embedded baking mechanism so to integrate the etching and baking functions in the same processing chamber for processing efficiency and quality. In the present embodiment, the chemical removal function includes gas chemical etching (and cleaning), such as gas chemical etching to silicon oxide.

The CRC 102 includes various chamber walls 202 integrated together such that the enclosed space 204 is isolated from the environment and can be maintained at a suitable state, such as vacuum or a low pressure. For example, the chamber walls 202 are made of suitable metal or metal alloy, such as aluminum. The CRC 102 also includes a substrate stage 206 to secure one or more workpiece(s) 208 (such as silicon wafers). In some examples, the substrate stage 206 is designed to secure 2, 4, or 6 wafers. The substrate stage 206 is designed with a mechanism to reduce temperature of the workpiece(s) 208. In the present embodiment, the substrate stage 206 is designed to with a cooling mechanism 210 to deliver and distribute coolant to the workpiece(s) 208 so that the workpiece(s) 208 can be cooled down. The coolant is controlled at a proper temperature and is circulated in a mode by the cooling mechanism 210 to cool down the workpiece(s) 208 efficiently and uniformly.

The CRC 102 also includes a pumping module 212 that is operable to maintain the chamber enclosed space 204 at vacuum state or a low pressure. In various examples, the pumping module 212 may include one or more pumps, and may utilize multiple pumping technologies, such as positive displacement pump, momentum transfer pump, regenerative pump or entrapment pump. Various pumps may be configured in series according to respective working ranges.

The CRC 102 includes a gas distribution plate 214 integrated in the chamber and designed to distribute one or more chemicals for proper etching, cleaning and baking, respectively. The gas distribution plate 214 includes multiple paths 216 designed to distribute chemical(s) uniformly to the workpiece(s) 208. The CRC 102 further includes one or more chemical delivery unit 218 coupled to the gas distribution plate 214 to deliver respective chemical to the chamber through the gas distribution plate 214. The chemical delivery unit 218 is connected a chemical supply source (such as 220A, 220B, 220C and 220D, collectively referred to as 220) to provide a chemical, and the chemical flow rate of the corresponding chemical is controlled by a valve 222. The chemical delivery unit 218 may further include a switch valve 223 being operable to switch between different chemical supply sources (such as between 220A and 220C or between 220B and 220D). At least one of the first and second chemical delivery units 218 is switchable to deliver one of hydrogen, argon and nitrogen. In various examples, the chemical is an etching gas or a carry gas, such as nitrogen, argon or other suitable gas. In the present embodiment, the CRC 102 includes two chemical delivery units 218 integrated in the chamber 102. In some embodiments, the chemical supply sources 220A, 220B, 220C and 220D are sources of hydrogen fluoride (HF), ammonia ($NH_3$), argon (Ar), and nitrogen gas ($N_2$), respectively. In furtherance of the embodiments, the first chemical delivery unit 218 is configured to deliver hydrogen fluoride or argon and the second chemical delivery unit 218 is configured to deliver ammonia or nitrogen gas. In the present embodiment, as the CRC 102 is used to etch silicon oxide, the corresponding etchant includes hydrogen fluoride and ammonia delivered to the CRC by the two chemical delivery units 218, respectively. The two chemical delivery units 218 may also be used to deliver argon, nitrogen, or both during a baking process to remove the by-product generated during the etching process to etch silicon oxide, which will be described later with the method 700. In some embodiments, the chemical delivery units 218 may be configured and connected to deliver hydrogen ($H_2$) gas for by-product removal. In other embodiments, the CRC 102 may include third chemical delivery unit 218 configured and connected to deliver hydrogen gas for by-product removal.

Figure 8:
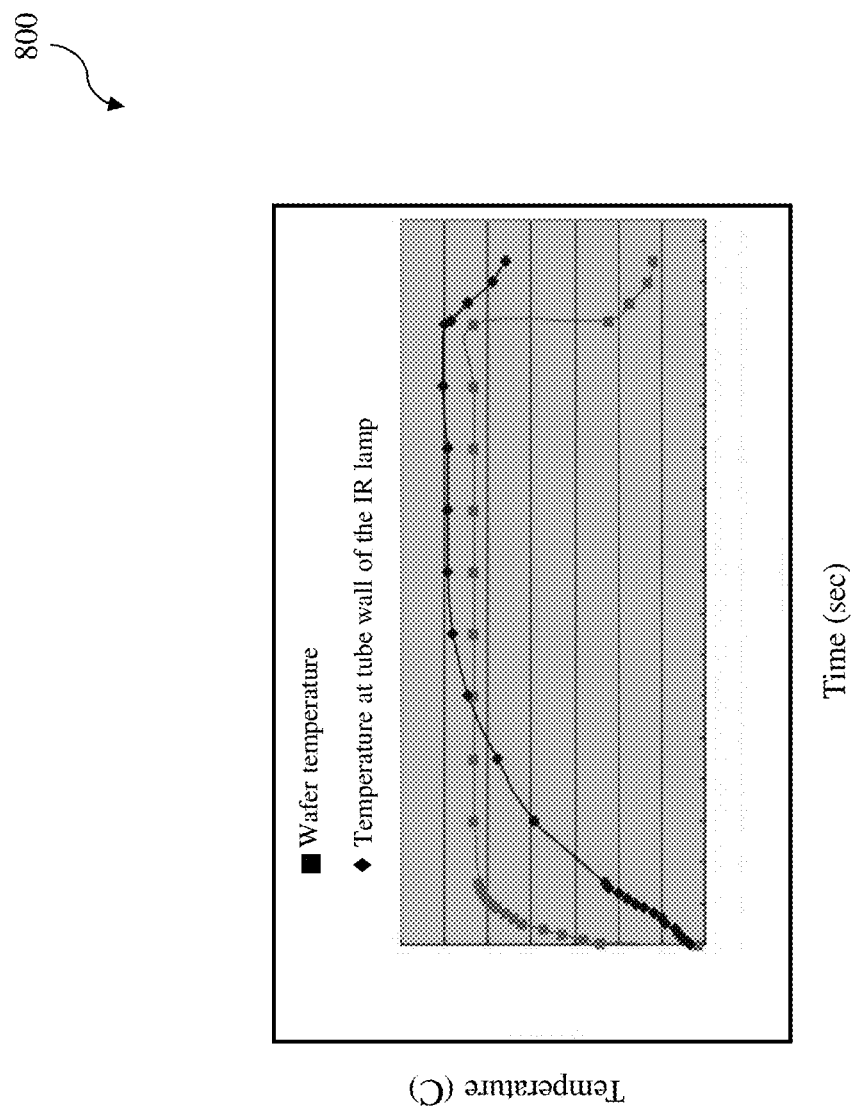
FIG. 8 is a graphic view of thermal characteristics of a heating mechanism of the semiconductor processing system of FIG. 1, constructed in accordance with some embodiments.

The CRC 102 further include a heating mechanism 224 embedded in the chamber to perform an in-situ baking process to the workpiece(s) 208 secured on the substrate stage 206 inside the chamber. The heating mechanism 224 is designed to heating the workpiece(s) 208 effectively with ramping up and ramping down quickly to increase the processing throughput. In some embodiments, the heating mechanism 224 includes an infrared (IR) lamp. The IR lamp is advantages for its heating efficiency and cooling capability, which can achieve 260° C. and roll back to room temperature within 40 second, as illustrated a diagram 800 in FIG. 8 according to some experiments. Since the decomposition temperature of the by-product ($NH_4)_2SiF_6$ is greater than 100° C. at 1 atmospheric pressure, the IR lamp is capable of removing the by-product via heat convection (e.g. $N_2$, Ar, or $H_2$) and irradiation. In some example, the IR lamp has a spectrum centered at about 3 micrometer ($\mu m$) as the IR absorption by water is peaked at 3 $\mu m$.

In some embodiments, the heating mechanism 224 includes a microwave source. The microwave source is designed with spectrum to enhance the microwave absorption and the by-product removal. For example, the by-product can be removed through water molecule vibration after absorbing microwave with wavelength in the range of 2800-3200 nm. In some embodiments, the heating mechanism 224 includes both IR lamp and microwave source to collectively heat and remove the by-product.

In some embodiments, the heating mechanism 224 includes a flash lamp unit that has the characteristics of ultimate short-time annealing in the order of the millisecond and consecutive spectrum with the wavelength of 200 to 800 nm (UV to visible wavelength light).

The heating mechanism 224 is configured to heat the workpiece(s) 208 efficiently and uniformly. For example, the heating mechanism 224 includes one or more components configured such that the heating energy is substantially directed to the workpiece(s) 208 and is distributed to the workpiece(s) 208 with uniform thermal energy density or uniform temperature distribution. In various embodiments, the heating mechanism 224 may have a proper geometry, size and location to achieve the desired thermal effect; and may have multiple components configured for improved thermal effect; and may further include supplemental components (such as reflector) to improve the thermal efficiency.

The CRC 102 may further include a thermal controller 226 integrated with the heating mechanism 224 such that to control the heating function with a proper heating profile over baking process, such as ramping up and ramping down the heating power and the wafer temperature. In a furtherance of the embodiment, the thermal controller 226 is further coupled with the cooling mechanism 210 to collectively control both the heating mechanism 224 and the cooling mechanism 210 to effectively control the wafer temperature for efficient removal of the by-product with increased throughput. The CRC 102 may further includes components, modules and parts integrated together to be functional for IC fabrication, such as gas chemical etching and cleaning.

Figure 3:
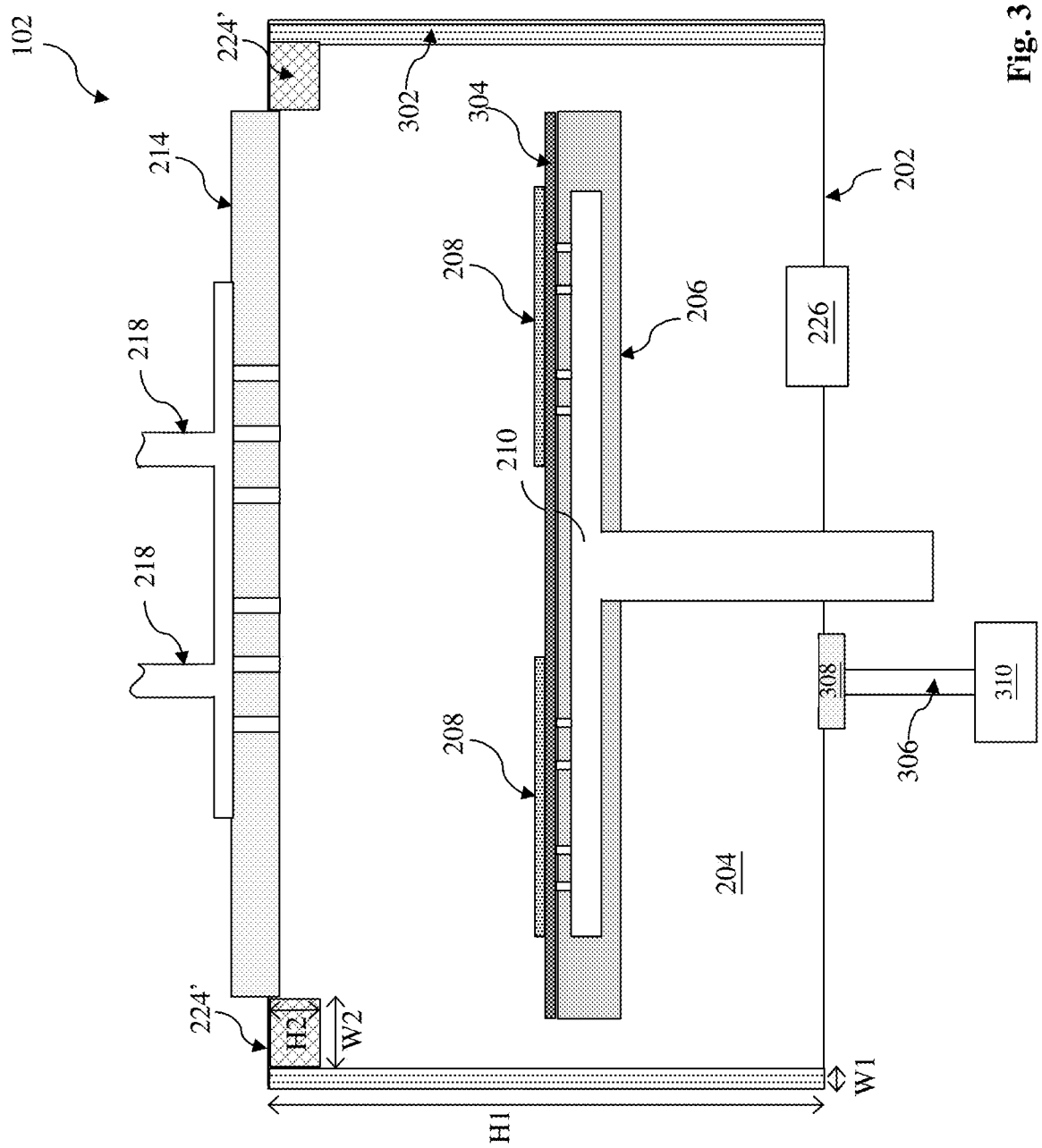
FIG. 3 illustrates a schematic view of a processing chamber of the system in FIG. 1, constructed in accordance with some embodiments.
Figure 4A:
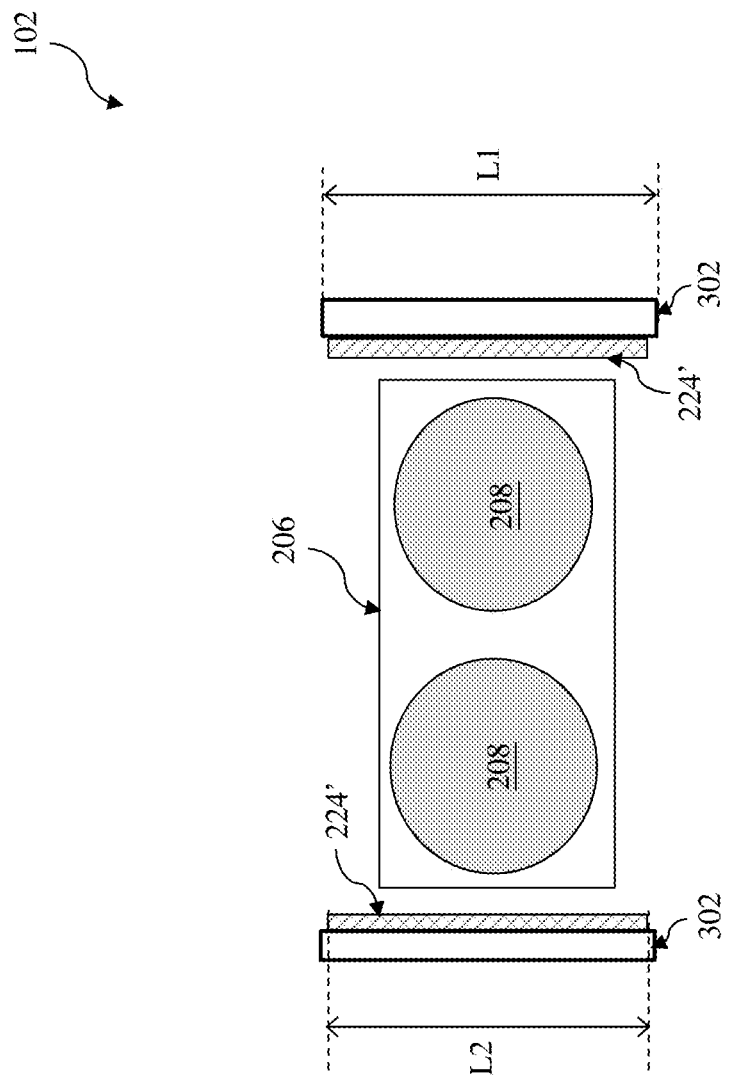
FIGS. 4A, 4B, 4C and 4D illustrate schematic top views of the processing chamber of FIG. 3, constructed in accordance with various embodiments.

FIG. 3 illustrates a schematic view of the CRC 102, in portion, constructed in accordance with some embodiments. FIG. 4A illustrates a schematic top view of the CRC 102, in portion, constructed in accordance with some embodiments. Particularly, the CRC 102 includes a heating mechanism 224' configured on the upper edge of the chamber and a reflective mirror 302 configured on the sidewalls of the chamber to reflect the thermal energy from the heating mechanism 224' to the workpiece(s) 208 on the substrate stage 206.

The reflective mirror 302 may be sized to match the sidewalls of the chamber and is shaped to surround the substrate stage 206, such as shaped as cylindrical surfaces or rectangle surfaces, depending on the chamber shape. The reflective mirror 302 has a height $H_1$, a width $W_1$ and a length $L_1$. In some examples, the height $H_1$ ranges between 80 mm and 130 mm; the width $W_1$ ranges between 10 mm and 15 mm; and the length $L_1$ ranges between 300 mm and 400 mm. The reflective mirror 302 is made of a suitable material, such as aluminum. In some embodiment, the reflective mirror 302 is integrated with the chamber walls 202 as a portion of the chamber walls. In some other examples, the reflective mirror 302 is designed with a surface pattern that is capable of redirecting the thermal energy from the heating mechanism 224 toward the workpiece(s) 208 more effectively.

In some embodiments, the heating mechanism 224' includes a heating unit (such as IR lamp or microwave source) in a rectangular shape. Alternatively, the heating mechanism 224' includes two or more heating units configured to provide uniform thermal energy to the workpiece(s) 208. In some examples, the heating unit is shaped in rectangle and is sized with a height $H_2$, a width $W_2$, and a length $L_2$. In some embodiments, the height $H_2$ ranges between 20 mm and 40 mm; the width $W_2$ ranges between 10 mm and 15 mm; and the length $L_2$ ranges between 300 mm and 400 mm. In one embodiment where the heating mechanism 224 includes an IR lamp, the emission of the IR lamp has an emission wavelength ranging between 2800 nm and 3200 nm, or the emission of the IR lamp is substantially (such as more than 90%) within the wavelength range 2800 nm and 3200 nm.

The IR lamp may be configured in an array and uses a filament material such as tungsten, carbon, or alloys of iron, chromium, and aluminum. The IR lamp may use ceramic infrared radiant heater. The IR lamp may use a gold coating on a quartz tube. The IR lamp may be packaged with a transparent window of silicon or carbon rich material, such as quartz, so that the infrared emission can pass and transmit to the workpiece(s) 208. The IR lamp may further use ceramic coating (such as aluminum oxide $Al_2O_3$) for HF anti-corrosion.

In the present embodiment, the heating mechanism 224' is integrated between the gas distribution plate 214 and the reflective mirror 302 for effectively reflecting the thermal energy from the heating mechanism 224' toward the workpiece(s) 208 and further toward the etching chemical gas delivered from the gas distribution plate 214 to the workpiece(s) 208. The heating mechanism 224' is designed to generate non-uniform thermal energy on its surface such that the thermal energy directed to the substrate stage 206 is uniformly distributed on the workpiece(s) 208. For example, the heating mechanism 224' is designed to have a grading thermal power density from the center to the edges with highest thermal power density at the center.

Figure 4B:
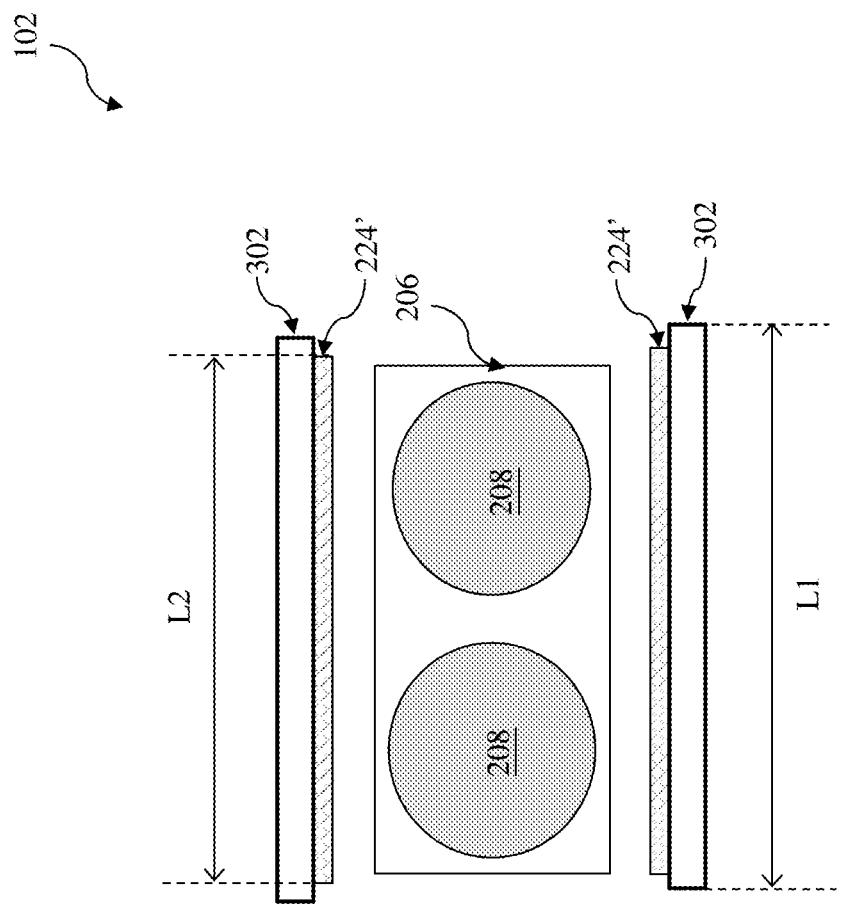

The heating mechanism 224' and the reflective mirror 302 may be configured differently. In some embodiments, two workpiece(s) 208 are secured on the single substrate stage 206 for the corresponding thermal treatment; and the heating mechanism 224' includes two heating units configured on the longer sides of the substrate stage 206, as illustrated in FIG. 4B. The reflective mirrors 302 are configured on the longer sides of the substrate stage 206 as well. The corresponding length $L_1$ of the reflective mirrors and length $L_2$ of the heating units are both sized in a range between 600 mm and 800 mm, according to some examples.

Figure 4C:
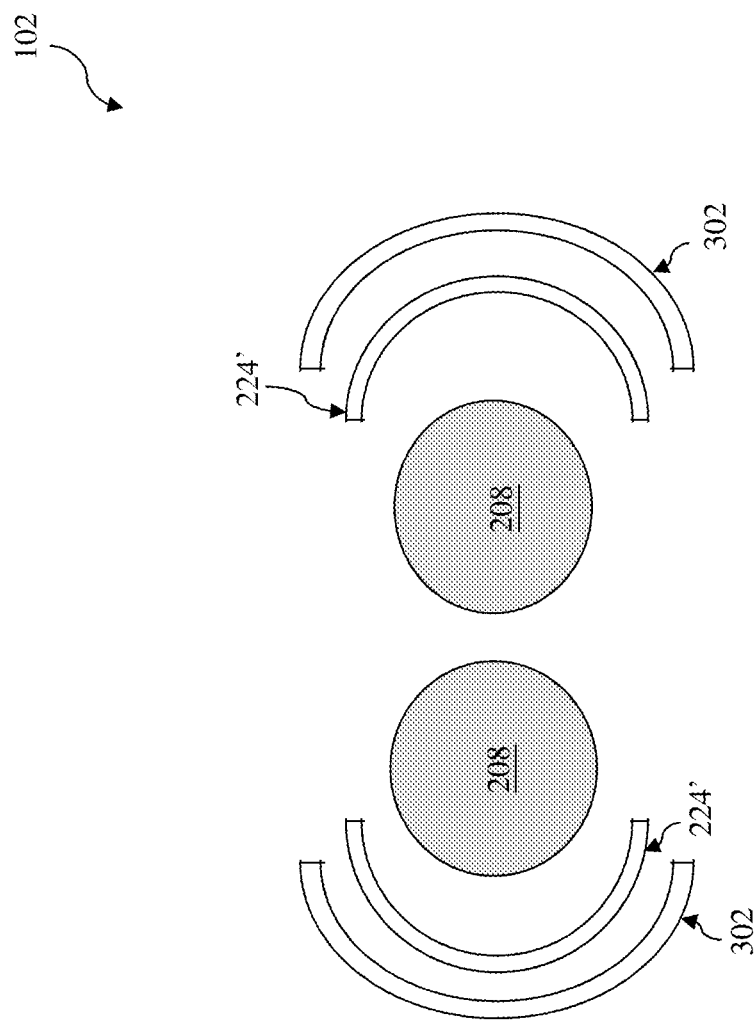

In some examples, the heating mechanism 224' is designed to be curved around the workpiece(s) 208 as illustrated in FIG. 4C in a schematic top view, in portion, according to some embodiments. The curvature may vary to optimize the thermal energy distribution on the workpiece(s) 208.

For the similar reason, the reflective mirror 302 is designed with a different geometry and pattern to reflect the thermal energy toward the workpiece(s) 208 uniformly. In some examples, the reflective mirror 302 includes two reflective mirror units designed to be curved around the workpiece(s) 208 as illustrated in FIG. 4C.

Figure 4D:
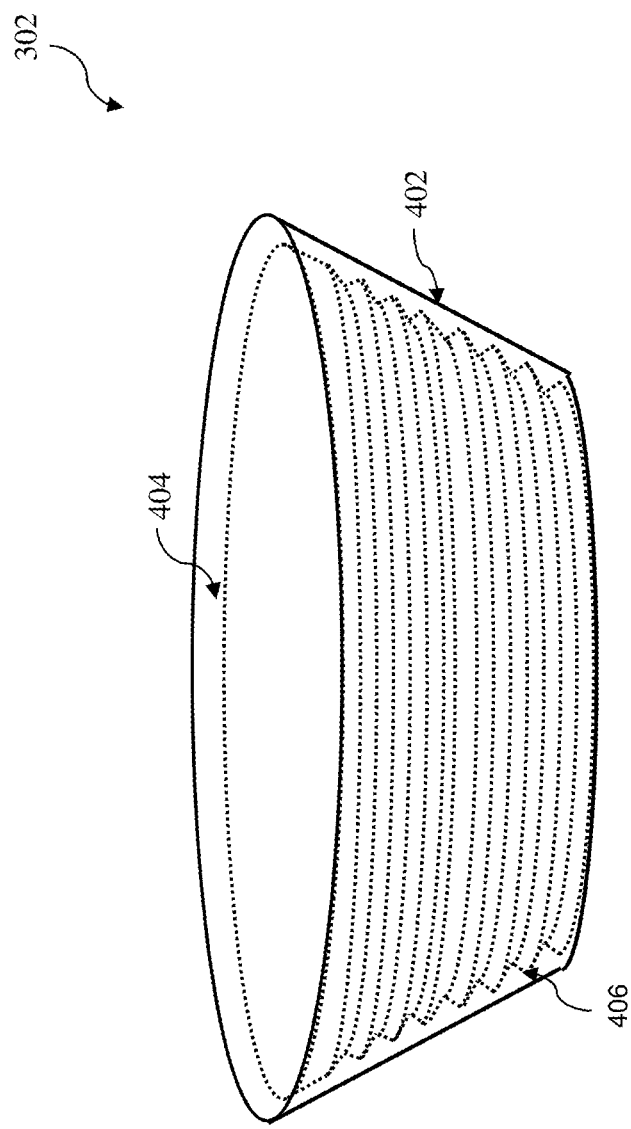

In some other embodiments, the reflective mirror 302 has a cylindrical shape with varying radius along the height or oval shape with varying semi-major and semi-minor axes. In some embodiments, the reflective mirror 302 has a textured pattern designed to reflect the thermal energy toward the workpiece(s) uniformly, as illustrated in FIG. 4D in a schematic view. The reflective mirror 302 includes an outer surface 402 and an inner surface 404 (illustrated by dashed lines in FIG. 4D).

The inner surface 404 of the reflective mirror 302 has a textured pattern designed so that the reflected thermal energy is directed towards the workpiece(s) 208 uniformly. In these ways and others, the reflector mirror 302 having the textured pattern on the inner surface 404 provides greater control over where the reflected energy falls on the workpiece(s) 208. To achieve this, the textured pattern may include one or more circumferential ridges 406 aligned with the circumference of the cylindrical body (or oval body) that extend any suitable depth into the inner surface 404. The circumferential ridges 406 are enlarged to provide clarity, and in various exemplary embodiments, the ridges 406 have a peak-to-trough height of between about 1 mm to about 5 mm. The particular height may be selected to control where the reflected thermal energy is received on the workpiece(s) 208.

The circumferential ridges 406 may be formed by any suitable process or processes. In some examples, the circumferential ridges 406 are formed by mechanical means such as cutting or forming (e.g., bending, tucking, stretching, etc.), which may be followed by polishing. In some examples, the circumferential ridges 406 are formed by chemical means such as chemical etching, which may be performed as part of a polishing process. In further examples, the circumferential ridges 406 are formed by a combination of both mechanical and chemical means.

While the circumferential ridges 406 in the embodiments of FIG. 4D are uniform in peak-to-trough height and trough-to-trough width, in other embodiments, the circumferential ridges 406 vary along the textured region. By varying the circumferential ridge 406, the angle of the surfaces of the circumferential ridge 406 can be tuned in order to control where energy reflected by the circumferential ridge 406 falls on the workpiece(s) 208.

In some embodiments, the peak-to-trough height of the circumferential ridges 406 varies along the textured region. For examples, circumferential ridges 406 near the top of the reflective mirror 302 have a greater peak-to-trough height than circumferential ridges 406 near the bottom of the reflective mirror 302, although this is merely exemplary and in further embodiments, the opposite is true (i.e., circumferential ridges 406 near the bottom of the reflective mirror 302 have a greater peak-to-trough height than circumferential ridges 406 near the top of the reflective mirror 302).

Referring back to FIG. 3, the CRC 102 may further include a silicon cover 304 configured on the substrate stage 206 to speed up wafer cooling effect. The substrate stage 206 is made of a suitable material, such as aluminum. During the etching and cleaning process, the substrate stage 206 is maintained at a proper temperature, such as a temperature below 45° C. In the present embodiment, the gas distribution plate 214 is made of aluminum or other suitable material. The vertical gap between the gas distribution plate 214 and the substrate stage 206 is maintained at a proper dimension, such as in a range from 50 mm to 100 mm for etching and cleaning efficiency.

The CRC 102 may include a pumping mechanism integrated to the chamber. The pumping mechanism further includes a pumping line 306 coupled to the chamber walls 202; a valve 308 for controlling the chamber pressure; and a pump 310, such as a dry pump. Integrated together for exhausting the gas and controlling the chamber pressure.

Figure 5:
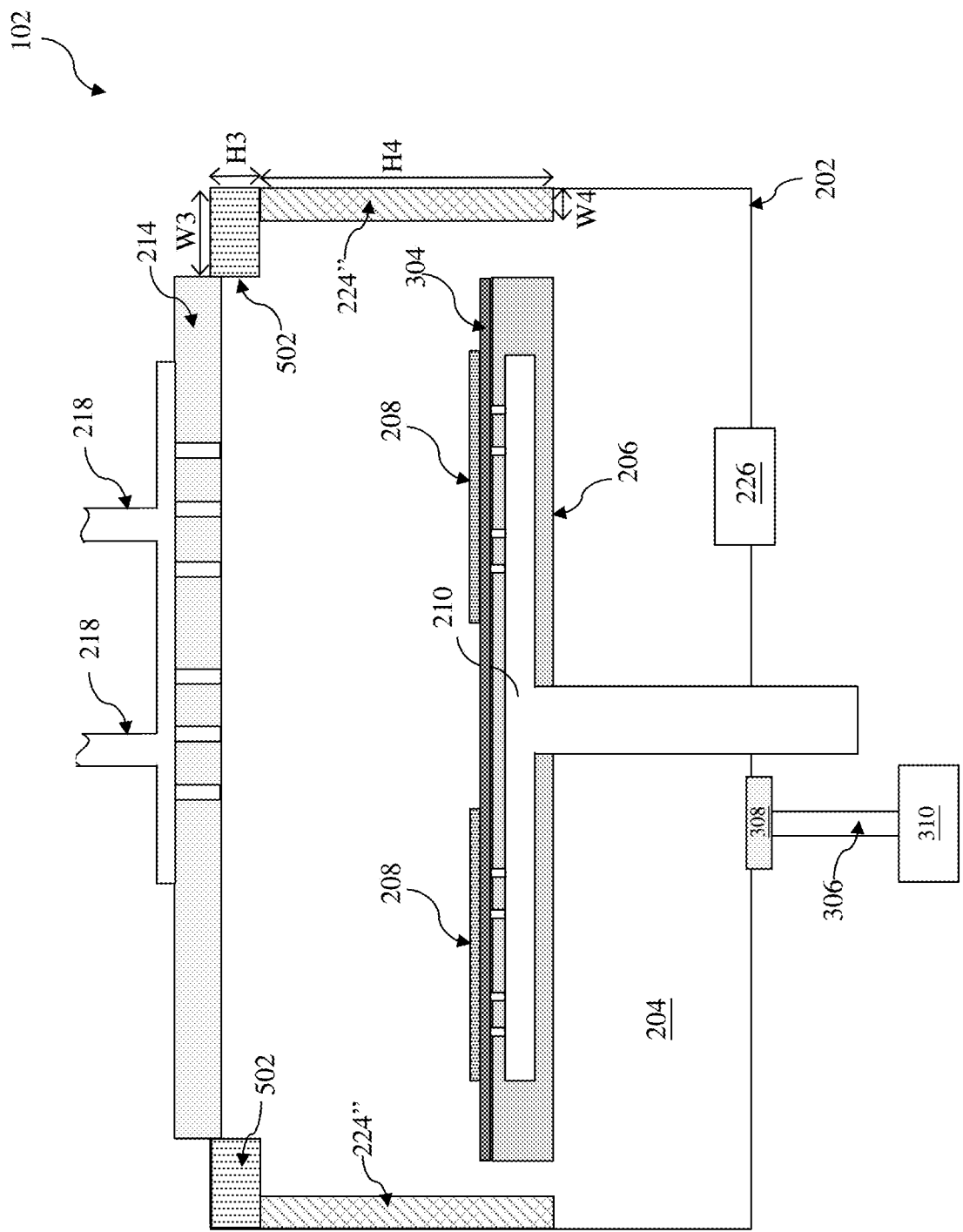
FIG. 5 illustrates a schematic view of a processing chamber of the system in FIG. 1, constructed in accordance with some embodiments.

FIG. 5 illustrates a schematic view of the CRC 102, in portion, constructed in accordance with some embodiments. The CRC 102 in FIG. 5 is similar to the CRC 102 in FIG. 3 but the heating mechanism and the reflective mirror are designed and configured differently. Particularly, the CRC 102 includes the heating mechanism 224" configured on the sidewalls 202 of the chamber and a reflective mirror 502 configured on the upper edge of the chamber to reflect the thermal energy from the heating mechanism 224" to the workpiece(s) 208 on the substrate stage 206.

The reflective mirror 502 may be sized to match the dimensions of the chamber and is shaped to surround the substrate stage 206, such as shaped as cylindrical surfaces or rectangle surfaces, depending on the chamber shape. The reflective mirror 502 has a height $H_3$, a width $W_3$ and a length $L_3$. In some examples, the height $H_3$ ranges between 20 mm and 40 mm; the width $W_3$ ranges between 25 mm and 30 mm; and the length $L_3$ ranges between 300 mm and 400 mm. The reflective mirror 502 is made of a suitable material, such as aluminum. In some embodiment, the reflective mirror 502 is integrated with the chamber walls 202 as a portion of the chamber walls. In some other examples, the reflective mirror 502 is designed with a surface pattern that is capable of redirecting the thermal energy from the heating mechanism 224" toward the workpiece(s) 208 more effectively.

Figure 6:
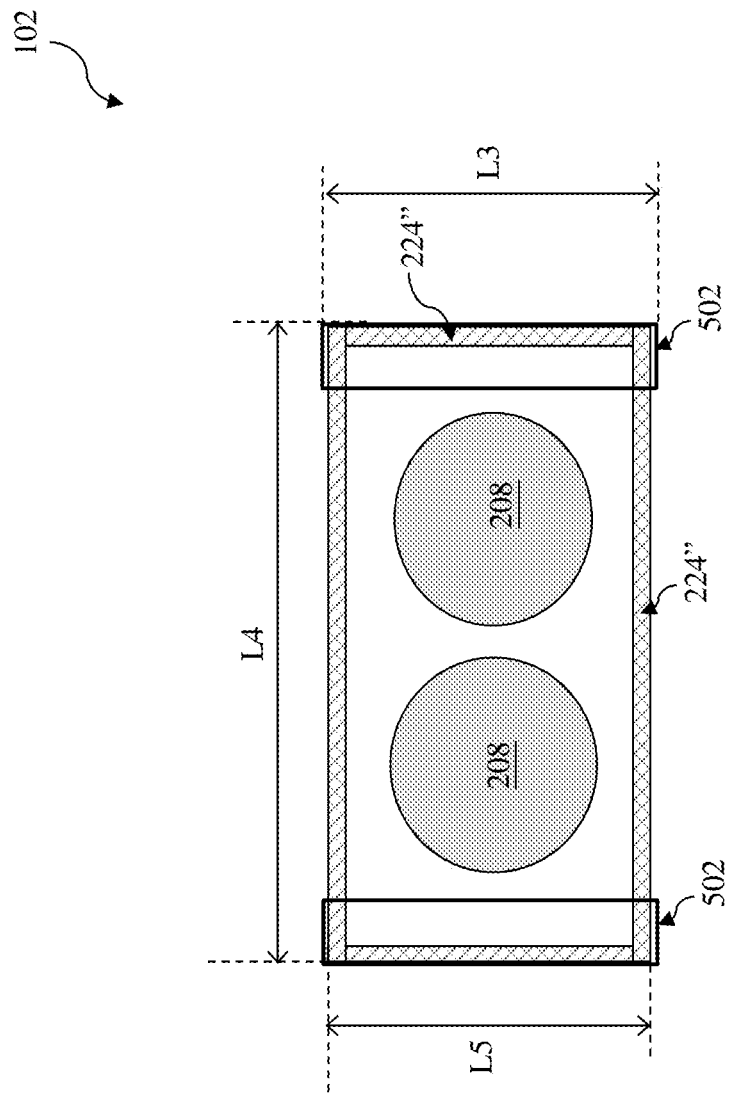
FIG. 6 illustrates a schematic top view of the processing chamber of FIG. 5, constructed in accordance with some embodiments.

The heating mechanism 224" (such as IR lamp or microwave source) is configured on the sidewalls of the chamber and surrounds the workpiece(s) 208 on the substrate stage 206. In some embodiments, the heating mechanism 224" is designed in a ring shape, as further illustrated in FIG. 6 in a schematic top view of the heating mechanism 224" and the workpiece(s) 208 on the substrate stage. In furtherance of the embodiments, the heating mechanism 224" includes 4 segments to match the chamber geometry. In some examples, the heating mechanism 224" is sized with a height $H_4$, a width $W_4$, and a first length $L_4$ for long segments and a second length $L_5$ for short segments. In some embodiments, the height $H_4$ ranges between 50 mm and 90 mm; the width $W_4$ ranges between 20 mm and 40 mm; the length $L_4$ ranges between 700 mm and 800 mm; and the length $L_5$ ranges between 350 mm and 400 mm.

In some other embodiments, the heating mechanism may be designed and configured differently to achieve the enhanced performance for the intended processing. For example, the heating mechanism includes both the IR lamp and the microwave source. The heating mechanism includes multiple components configured at various locations for uniform distribution of the thermal energy to the workpiece (s) 208 on the substrate stage 206.

Figure 7:
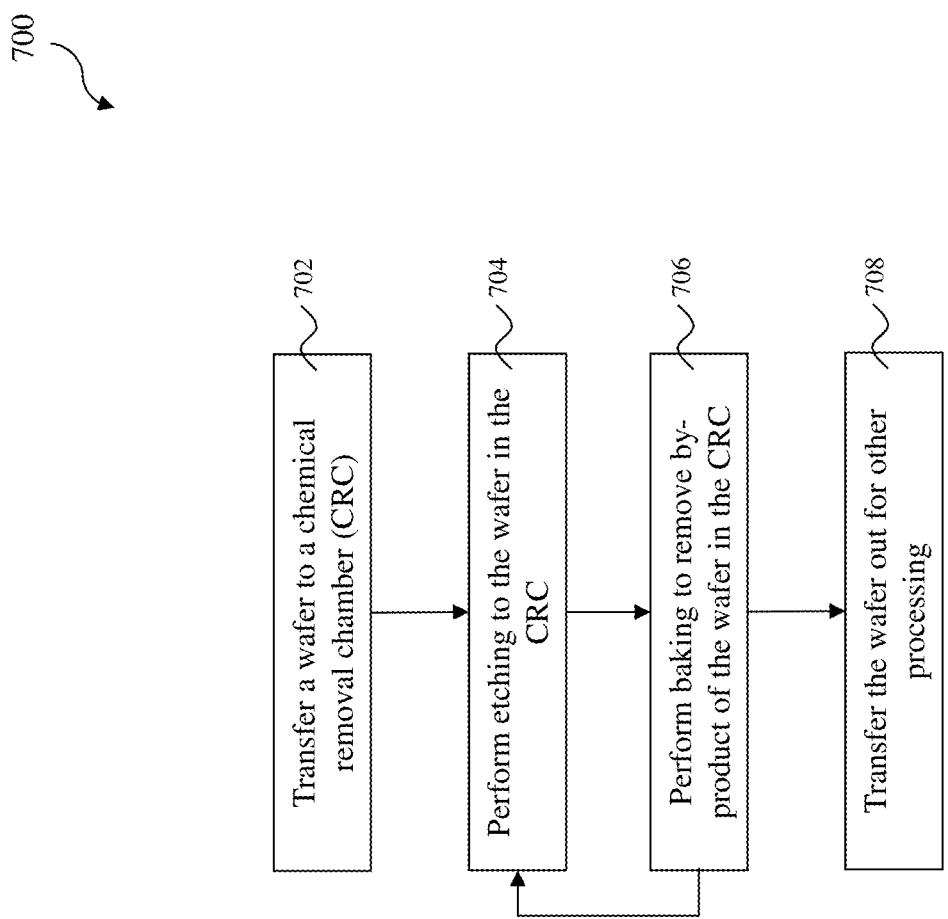
FIG. 7 illustrates a flowchart of a method for semiconductor processing utilizing the system in FIG. 1, constructed in accordance with some embodiments.

FIG. 7 is a flowchart of a method 700 of fabricating one or more workpiece(s) 208 in accordance with some embodiments. The method 700 is implemented in the semiconductor processing system 100 of FIG. 1, particularly in the CRC 102 of the system 100. The method 700 is described with reference to FIG. 7 and other figures.

The method 700 includes an operation 702 by providing a semiconductor processing system 100 and transferring one or more workpiece(s) 208 to a CRC 102, such as by a vacuum transfer module 106. In the present embodiment, the substrate stage 206 is designed to hold two wafers, therefore, two wafers 208 are transferred into the CRC 102 sequentially or in parallel. The following description of the operation only focus on one workpiece but it is understood that two or more workpieces may be processed, depending on the capacity of the substrate stage 206.

The method 700 proceeds to an operation 704 to perform an etching process to the workpiece(s) 208, such as removing silicon oxide in the present embodiment. In one example, the shallow trench isolation (STI) features may be formed on the wafer, then the STI features are recessed to form fin active regions. In furtherance of the example, the STI features include silicon oxide and the recessing the STI features etches the silicon oxide.

During the operation 704, the heating mechanism 224 is turned off and the cooling mechanism 210 is applied to cool down the wafers 208 on the substrate stage 206 to a lower temperature, such as below 45° C. The chemical delivery units 218 are open to deliver the gas chemicals, such as HF and $NH_3$, respectively, in the present embodiment. The gas chemicals HF and $NH_3$ are directed to the wafers through the gas distribution plate 214 are reacted with the silicon oxide of the wafers 208, thereby removing the silicon oxide. The chemical reaction is expressed in a formula as $SiO_2 + 4HF + NH_3 \rightarrow SiF_4 + 2H_2O + NH_3$. The reaction products further react, as expressed in a formula as $SiF_4 + 2HF + 2NH_3 \rightarrow (NH_4)_2SiF_6$. Among these, $(NH_4)_2SiF_6$, as the reaction by-product, is left on the wafers as residue and need to be removed. The other reaction products are exhausted away through the exhaust mechanism 212, such as the pumping line 306, the valve 308 and the pump 310.

The method 700 proceeds to an operation 706 to perform a baking process to the workpiece(s) 208 in the same CRC 102, thereby removing the by-product, such as $(NH_4)_2SiF_6$ in the present case. During the operation 706, the cooling mechanism 210 is turned off; the heating mechanism 224 is turned on and is applied to bake the wafers 208 on the substrate stage 206 to a higher temperature, such as above 100° C. since the by-product $(NH_4)_2SiF_6$ is decomposed and removed at the temperature above 100° C. The heating mechanism 224, due to its heating capacity, can achieve a baking temperature 260° C. or higher, therefore the cleaning of the by-product is more efficient. The chemical delivery units 218 are open to deliver the gas, such argon, nitrogen, or hydrogen, in the present embodiment. The chemical reaction is expressed in a formula as $(NH_4)_2SiF_6 \rightarrow SiF_4 + 2NH_3 + 2HF$. The reaction products are guided away from the chamber by the exhaust mechanism 212 or 306.

Since the etching to remove the silicon oxide and the removal of the by-product are performed in a same chemical removal chamber 102, the two operations 704 and 706 may be repeated in multiple cycles to etch silicon oxide and remove the by-product timely, until the completion of the etching process. It is more efficient since the two operations are performed in the same chamber without transfer the workpiece(s) 208 among different chambers. Furthermore, the heating mechanism 224 (such as IR lamp or microwave source) embedded in the etch chamber 102 has capacity to ramp up the temperature fast and can reach to a baking temperature 260° C. or higher, the removal of the by-product is more efficient with further increased throughput. As such, the system 100 may eliminate the baking chamber 104 and is equipped with all chemical removal chambers 102 to further increase the throughput.

During various embodiments, the controller 226 is coupled with the heating mechanism 224, the cooling mechanism 210 or both to provide proper thermal profiles to the workpiece(s) 208 during the etching process in the operation 704 and the baking process in the operation 706, respectively. For example, the controller 226 collectively controls the heating mechanism 224 and the cooling mechanism 210, and coordinates the both to provide efficient temperature ramping up and ramping down during the baking process and the etching process, respectively.

Since the system 100 includes multiple processing chambers, such as multiple chemical removal chambers 102, those chemical removal chambers 102 implements the operation 704 for etching and the operation 706 for baking to respective workpieces 208 in parallel. As the chemical removal chambers 102 can perform both etching and baking, the baking chambers may be eliminated from the system 100. Thus, the system 100 can include a large number of chemical removal chambers to further increase the throughput.

The method 700 may include other operations, such as an operation 708 to transfer the workpiece(s) 208 out the system after the completion of the etching silicon oxide and the removal of the by-product. The semiconductor processing system 100 is described with silicon oxide etching in the present embodiment. However, the system 100 is not limited and may be used for other IC fabrication with the similar characteristics, such that the heating mechanism 224 is embedded in the processing chamber to perform baking process as well.

Figure 9:
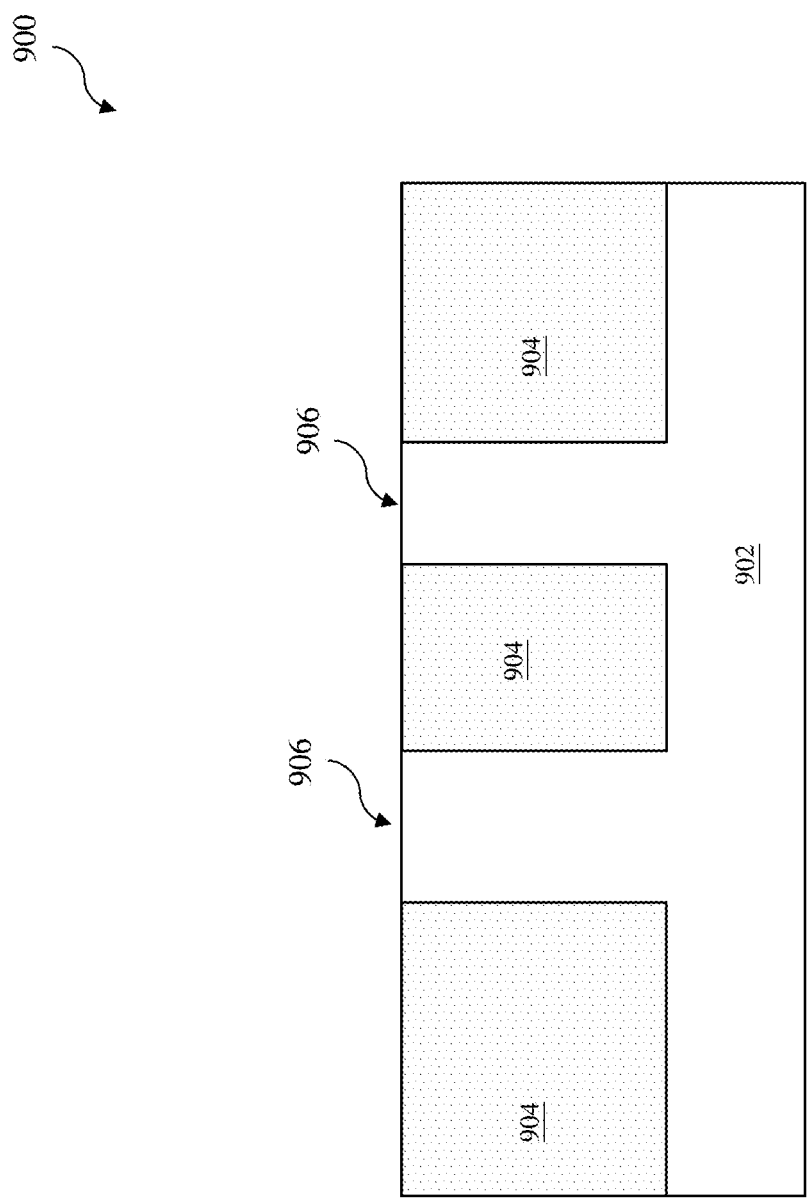
FIGS. 9 and 10 are sectional views of a semiconductor structure made by a method of FIG. 7, constructed in accordance with some embodiments.
Figure 10:
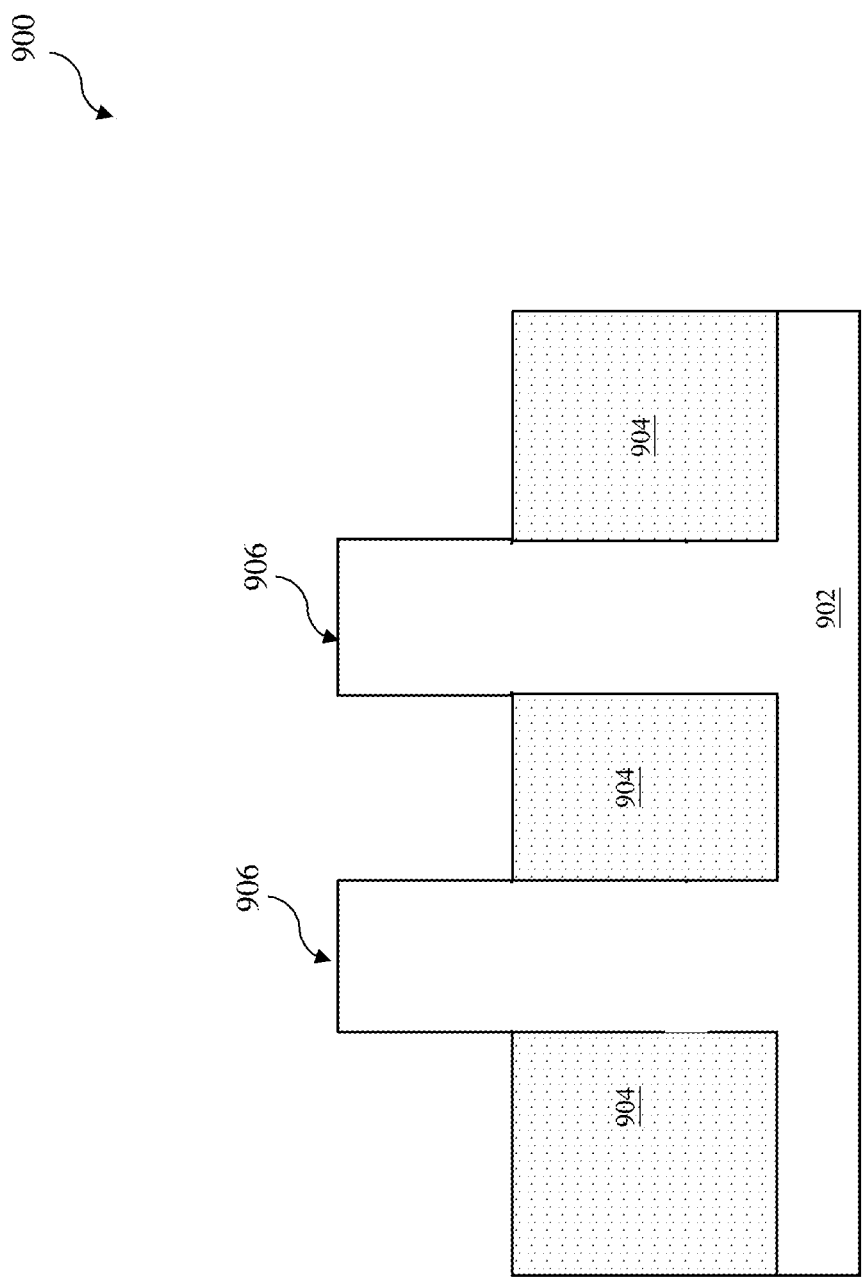

According to some embodiments, the method 700 is used to recess the STI features during a process to form fin active regions. This is further described with a semiconductor structure 900. FIGS. 9 and 10 are sectional views of the semiconductor structure 900 at various fabrication stages. As illustrated in FIG. 9, the semiconductor structure 900 includes a semiconductor substrate 902. The semiconductor substrate 902 includes silicon. In some other embodiments, the substrate 902 includes germanium, silicon germanium or other proper semiconductor materials. The substrate 902 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor substrate 902 also includes various doped regions such as n-well and p-wells. In one embodiment, the semiconductor substrate 902 includes an epitaxy (or epi) semiconductor layer. In another embodiment, the semiconductor substrate 902 includes a buried dielectric material layer for isolation formed by a proper technology, such as a technology referred to as separation by implanted oxygen (SIMOX). In some embodiments, the substrate 902 may be a semiconductor on insulator, such as silicon on insulator (SOI).

Still referring to FIG. 9, shallow trench isolation (STI) features 904 are formed on the semiconductor substrate 902. In some embodiments, the STI features 904 are formed etching to form trenches, filling the trenches with dielectric material and polishing to remove the excessive dielectric material and planarize the top surface. One or more etching processes are performed on the semiconductor substrate 902 through openings of soft mask or hard mask, which are formed by lithography patterning and etching. The formation of the STI features 904 are further described below in accordance with some embodiments.

In the present example, a hard mask is deposited on the substrate 902 and is patterned by lithography process. The hard mask layers include a dielectric such as semiconductor oxide, semiconductor nitride, semiconductor oxynitride, and/or semiconductor carbide, and in an exemplary embodiment, the hard mask layer include a silicon oxide film and a silicon nitride film. The hard mask layer may be formed by thermal growth, atomic layer deposition (ALD), chemical vapor deposition (CVD), high density plasma CVD (HDP-CVD), other suitable deposition processes.

A photoresist layer (or resist) used to define the fin structure may be formed on the hard mask layer. An exemplary resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning.

In one embodiment, the resist layer is patterned to leave the portions of the photoresist material disposed over the semiconductor structure 900 by the lithography process. After patterning the resist, an etching process is performed on the semiconductor structure 900 to open the hard mask layer, thereby transferring the pattern from the resist layer to the hard mask layer. The remaining resist layer may be removed after the patterning the hard mask layer. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the hard mask layer may include wet etching, dry etching or a combination thereof. The etching process may include multiple etching steps. For example, the silicon oxide film in the hard mask layer may be etched by a diluted hydrofluorine solution and the silicon nitride film in the hard mask layer may be etched by a phosphoric acid solution.

Then an etching process is followed to etch the portions of the substrate 902 not covered by the patterned hard mask layer, resulting trenches in the substrate 902. The patterned hard mask layer is used as an etch mask during the etching processes to pattern the substrate 902. The etching process may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with particular trench profile for improved device performance and pattern density. In some examples, the semiconductor material of the substrate may be etched by a dry etching process using a fluorine-based etchant. Particularly, the etching process applied to the substrate is controlled such that the substrate 902 is partially etched. This may be achieved by controlling etching time or by controlling other etching parameter(s).

One or more dielectric material is filled in the trenches to form the STI feature 904. Suitable fill dielectric materials include semiconductor oxides, semiconductor nitrides, semiconductor oxynitrides, fluorinated silica glass (FSG), low-K dielectric materials, and/or combinations thereof. In various exemplary embodiments, the dielectric material is deposited using a HDP-CVD process, a sub-atmospheric CVD (SACVD) process, a high-aspect ratio process (HARP), a flowable CVD (FCVD), and/or a spin-on process.

The deposition of the dielectric material may be followed by a chemical mechanical polishing/planarization (CMP) process to remove the excessive dielectric material and planarize the top surface of the semiconductor structure. The CMP process may use the hard mask layers as a polishing stop layer to prevent polishing the semiconductor material of the substrate 902. In this case, the CMP process completely removes the hard mask. The hard mask may be removed alternatively by an etching process. Although in further embodiments, some portion of the hard mask layers remain after the CMP process.

Referring to FIG. 10, a recessing process is applied to the STI features to selectively recess the STI features 904, thereby forming the fin structure 906 having multiple fin active regions. In this operation, the STI features 904 are recessed such that the fin active regions 906 are extruded above the STI features 904. The recessing process employs the method 700, especially the operations 704 and 706. In some embodiments, the operations 704 and 706 are implemented in multiple cycles as described above.

After the formation of the fin active regions 906, other operations may follow. For example, gate stacks, sources and drains are formed on the fin active regions in a configuration and connections to form an integrated circuit with multiple field-effect transistors.

The present disclosure provides an IC fabrication system and a method utilizing the same. The system includes one or more chemical removal chamber with an embedded heating mechanism, such as IR lamp or microwave. By utilizing the disclosed IC fabrication system, the etching process (such as gas chemical to etch silicon oxide) and the removal of the by-product are performed in a same chamber are more efficient with enhanced fabrication throughput.

The embodiments of the present disclosure offer advantages over existing art, though it is understood that other embodiments may offer different advantages, not all advantages are necessarily discussed herein, and that no particular advantage is required for all embodiments. Various advantages may present in some embodiments. For example, since the etching to remove the silicon oxide and the removal of the by-product are performed in a same chemical removal chamber 102, the two operations 704 and 706 may be repeated in multiple cycles to etch silicon oxide and remove the by-product timely, until the completion of the etching process. In other embodiments, the operations 704 and 706 are implemented simultaneously to etch silicon oxide by the etchant (that includes hydrogen fluoride and ammonium) and to remove the by-product by baking with a gas (such as hydrogen, nitrogen, argon, or a combination thereof).

The method is more efficient since the two operations are performed in the same chamber without transfer the workpiece(s) 208 among different chambers. Further, the heating mechanism 224 (such as IR lamp or microwave source) embedded in the etch chamber 102 has capacity to ramp up the temperature fast and can reach to a baking temperature 260° C. or higher, the removal of the by-product is more efficient with further increased throughput. As such, the system 100 may eliminate the baking chamber 104 and equipped with all chemical removal chambers 102 to further increase the throughput.

Thus, the present disclosure provides a semiconductor fabrication apparatus in accordance with some embodiments. The semiconductor apparatus includes a processing chamber for etching; a substrate stage integrated in the processing chamber and being configured to secure a semiconductor wafer; a reflective mirror configured inside the processing chamber to reflect thermal energy from the heating mechanism toward the semiconductor wafer; and a heating mechanism embedded in the process chamber and is operable to perform a baking process to remove a by-product generated during the etching. The heating mechanism is integrated between the reflective mirror and a gas distribution plate of the processing chamber.

The present disclosure provides a semiconductor fabrication apparatus in accordance with some embodiments. The semiconductor fabrication apparatus includes a processing chamber to perform an etching process to remove a dielectric material; a substrate stage integrated in the processing chamber and being configured to secure a semiconductor wafer; a heating mechanism embedded in the process chamber and is operable to perform a baking process to remove a by-product generated by during the etching process; a reflective mirror integrated inside the processing chamber to reflect thermal energy from the heating mechanism toward the semiconductor wafer; and a gas distribution plate integrated inside the processing chamber to deliver a chemical gas to the semiconductor wafer for the etching process. The heating mechanism is integrated between the reflective mirror and the gas distribution plate. The heating mechanism includes one of an infrared lamp and a microwave source.

The present disclosure provides a method for semiconductor fabrication in accordance with some embodiments. The method includes providing a processing chamber that includes a substrate stage integrated in the processing chamber and being configured to secure a semiconductor wafer; and a heating mechanism embedded in the process chamber and is operable to perform a baking process. The heating mechanism is integrated between a reflective mirror and a gas distribution plate. The heating mechanism includes one of an infrared lamp and a microwave source. The method further includes performing an etching process to the semiconductor wafer in the processing chamber to remove silicon oxide; and performing a baking process to the semiconductor wafer in the processing chamber using the heating mechanism to remove the by-product.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor fabrication apparatus, comprising:
    a processing chamber for etching, the processing chamber having a sidewall and a top surface;
    a substrate stage integrated in the processing chamber and being configured to secure a semiconductor wafer;
    a gas distribution plate integrated inside the processing chamber, wherein the gas distribution plate defines a portion of the top surface of the processing chamber;
    a heating mechanism disposed on the top surface of the processing chamber and is operable to perform a baking process to remove a by-product generated during the etching; and
    a reflective mirror configured inside the processing chamber to reflect thermal energy from the heating mechanism toward the semiconductor wafer, the reflective mirror being located on the sidewall, wherein the heating mechanism is disposed horizontally between an end of a horizontal portion of the gas distribution plate and the reflective mirror, such that a portion of the heating mechanism is exposed to the substrate stage, and wherein the heating mechanism physically contacts an inner surface of the reflective mirror and an outermost edge of the gas distribution plate.

2. The semiconductor fabrication apparatus of claim 1, wherein the heating mechanism includes one of an infrared lamp, a microwave source, and a flash lamp unit.

3. The semiconductor fabrication apparatus of claim 1, wherein the processing chamber further includes:
    a first chemical delivery unit configured and operable to deliver hydrogen fluoride; and
    a second chemical delivery unit configured and operable to deliver ammonia, wherein the processing chamber is operable to etch silicon oxide.

4. The semiconductor fabrication apparatus of claim 1, wherein the reflective mirror includes a cylindrical body having the inner surface with a textured pattern that has circumferential ridges aligned with a circumference of the cylindrical body.

5. The semiconductor fabrication apparatus of claim 1, wherein the heating mechanism is configured on upper edges of the processing chamber.

6. The semiconductor fabrication apparatus of claim 5, wherein the heating mechanism includes two or more heating units configured along shorter sides of the substrate stage.

7. The semiconductor fabrication apparatus of claim 5, wherein the reflective mirror is configured in a ring shape.

8. A semiconductor fabrication apparatus, comprising:
    a processing chamber configured to perform an etching process to remove a dielectric material, the processing chamber having a sidewall and a top surface;
    a substrate stage integrated in the processing chamber and configured to secure a semiconductor wafer;
    a heating mechanism embedded in the processing chamber and operable to perform a baking process to remove a by-product generated during the etching process;
    a reflective mirror integrated inside the processing chamber to reflect thermal energy from the heating mechanism toward the semiconductor wafer, wherein the reflective mirror is disposed on and along the sidewall, wherein the heating mechanism physically contacts an inner surface of the reflective mirror, and wherein the inner surface of the reflective mirror includes a textured pattern; and
    a gas distribution plate integrated inside the processing chamber to deliver a chemical gas to the semiconductor wafer for the etching process, wherein the gas distribution plate is embedded in the top surface of the processing chamber, and wherein the gas distribution plate has an outermost edge facing the sidewall, such that the heating mechanism is disposed between the outermost edge of the gas distribution plate and the reflective mirror.

9. The semiconductor fabrication apparatus of claim 8, further comprising:
    a first chemical delivery unit integrated with the gas distribution plate and being operable to deliver hydrogen fluoride; and
    a second chemical delivery unit integrated with the gas distribution plate and being operable to deliver ammonia.

10. The semiconductor fabrication apparatus of claim 9, wherein at least one of the first and second chemical delivery units includes a switch valve being switchable to deliver one of hydrogen, argon and nitrogen.

11. The semiconductor fabrication apparatus of claim 8, further comprising a controller coupled with the heating mechanism wherein the controller is operable to control the heating mechanism during the baking process.

12. The semiconductor fabrication apparatus of claim 11, further comprising a cooling mechanism integrated with the substrate stage, wherein the cooling mechanism is operable to cool the semiconductor wafer by coolant.

13. The semiconductor fabrication apparatus of claim 12, wherein the controller is further coupled with the cooling mechanism, wherein the controller is operable to control the heating mechanism and the cooling mechanism during the etching process and the baking process.

14. The semiconductor fabrication apparatus of claim 8, further comprising multiple processing chambers each having an embedded heating mechanism and being operable to etch to remove silicon oxide and baking to remove the by-product.

15. The semiconductor fabrication apparatus of claim 8, wherein the reflective mirror includes a cylindrical body, and wherein the textured pattern of the inner surface has circumferential ridges aligned with a circumference of the cylindrical body.

16. The semiconductor fabrication apparatus of claim 8, wherein the heating mechanism includes one of an infrared lamp, a microwave source, and a flash lamp unit.

17. A semiconductor fabrication apparatus, comprising:
    a processing chamber for etching, the processing chamber having a first sidewall, a second sidewall opposite the first sidewall, and a top wall disposed between the first sidewall and the second sidewall;
    a first reflective mirror disposed along the first sidewall and a second reflective mirror disposed along the second sidewall, wherein the first reflective mirror and the second reflective mirror each includes a cylindrical body having an inner surface, and wherein the inner surface has a textured pattern that has circumferential ridges aligned with a circumference of the cylindrical body;

a substrate stage integrated in the processing chamber, the substrate stage having a first side facing the first sidewall and a second side facing the second sidewall, the substrate stage being configured to secure a first semiconductor wafer towards the first side and configured to secure a second semiconductor wafer towards the second side;

a gas distribution plate integrated in the processing chamber, wherein the gas distribution plate is configured as a portion of the top wall of the processing chamber; and a first heating element physically contacting the first reflective mirror and a second heating element physically contacting the second reflective mirror, wherein the first and the second heating elements are laterally disposed on opposite sides and against outermost edges of the gas distribution plate on the top wall, and wherein the first and second heating elements are operable to perform a baking process to remove a by-product generated during the etching.

18. The semiconductor fabrication apparatus of claim 17, wherein the first heating element is located between the first side of the substrate stage and the first sidewall, and wherein the second heating element is located between the second side of the substrate stage and the second sidewall.

19. The semiconductor fabrication apparatus of claim 17, further comprising a controller coupled with the first heating element and the second heating element, wherein the controller is operable to control the first heating element and the second heating element during the etching.

20. The semiconductor fabrication apparatus of claim 17, further comprising a cooling mechanism integrated with the substrate stage, wherein the cooling mechanism is operable to cool the first semiconductor wafer and the second semiconductor wafer by coolant.

\* \* \* \* \*